US008821697B2

(12) United States Patent
Li et al.

(10) Patent No.: US 8,821,697 B2
(45) Date of Patent: *Sep. 2, 2014

(54) SILVER SELENIDE SPUTTERED FILMS AND METHOD AND APPARATUS FOR CONTROLLING DEFECT FORMATION IN SILVER SELENIDE SPUTTERED FILMS

(71) Applicant: Micron Technology, Inc., Boise, ID (US)

(72) Inventors: Jiutao Li, Boise, ID (US); Allen McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/727,121

(22) Filed: Dec. 26, 2012

(65) Prior Publication Data
US 2013/0118894 A1    May 16, 2013

Related U.S. Application Data

(60) Continuation of application No. 12/841,035, filed on Jul. 21, 2010, now abandoned, which is a division of application No. 10/712,106, filed on Nov. 14, 2003, now Pat. No. 7,799,180.

(51) Int. Cl.
*C23C 14/34* (2006.01)

(52) U.S. Cl.
USPC ............ 204/192.25; 204/192.15; 204/192.17; 204/192.26; 204/192.27; 204/192.28

(58) Field of Classification Search
USPC ............. 204/192.15, 192.17, 192.25, 192.26, 204/192.27, 192.28
See application file for complete search history.

(56) References Cited

U.S. PATENT DOCUMENTS

| 4,500,408 | A | 2/1985 | Boys et al. |
| 4,818,357 | A | 4/1989 | Case et al. |
| 5,534,711 | A | 7/1996 | Ovshinsky et al. |
| 5,753,092 | A | 5/1998 | Hollars et al. |
| 7,799,180 | B2 * | 9/2010 | Li et al. .................... 204/192.15 |

OTHER PUBLICATIONS

3 Google Scholar searches dated Aug. 17, 2012.
Efendiev et al., "Effect of multiple phase transitions on the kinetics of alpha-beta transitions silver selenide," Doklady-Akademiya Nauk Azerbaidzhanskoi SSR, 1967.

(Continued)

*Primary Examiner* — Rodney McDonald
(74) *Attorney, Agent, or Firm* — Dickstein Shapiro LLP

(57) ABSTRACT

Method and apparatus for sputter depositing silver selenide and controlling defect formation in and on a sputter deposited silver selenide film are provided. A method of forming deposited silver selenide comprising both alpha and beta phases is further provided. The methods include depositing silver selenide using sputter powers of less than about 200 W, using sputter power densities of less than about 1 W/cm$^2$, using sputter pressures of less than about 40 mTorr and preferably less than about 10 mTorr, using sputter gasses with molecular weight greater than that of neon, using cooling apparatus having a coolant flow rate at least greater than 2.5 gallons per minute and a coolant temperature less than about 25° C., using a magnetron sputtering system having a magnetron placed a sufficient distance from a silver selenide sputter target so as to maintain a sputter target temperature of less than about 350° C. and preferably below about 250° C. during sputter deposition, and heating the sputter deposition substrate to greater than about 30° C.

15 Claims, 13 Drawing Sheets

(56) References Cited

OTHER PUBLICATIONS

Abdullayev et al., "Band Structure Investigation of Two Low Temperature Phases in Ag2Se," *Thin Solid Films*, 73 (1980) L7-L8.

Bernede, J.-C., "Switching and silver Movements in Ag2Se Thin Films," *phys. stat. sol.* (a) 57, K101 (1980).

Junod et al., "Metal-no-metal transition in silver chalcogenides," *Philosophical Magazine*, 1977, vol. 36, No. 4, 941-958.

Lau et al, "Temperature Rise During Film Deposition by rf and dc Sputtering," *J. Vac. Sci. Technol.*, vol. 9, No. 4, Jul.-Aug. 1972.

Rino et al., "A Molecular Dynamics Study of Superionic Ag2Se," *Solid State Ionics*, 32/33 (1989) 968-973.

\* cited by examiner

SILVER SELENIDE SPUTTERED FILMS AND METHOD AND APPARATUS FOR CONTROLLING DEFECT FORMATION IN SILVER SELENIDE SPUTTERED FILMS

This application is a continuation of U.S. application Ser. No. 12/841,035, filed Jul. 21, 2010, now abandoned, which is a divisional of U.S. application Ser. No. 10/712,106, filed Nov. 24, 2003, now U.S. Pat. No. 7,799,180, issued Sep. 21, 2010, both of which are incorporated herein by reference in their entirety.

FIELD OF THE INVENTION

This invention relates generally to a method and apparatus for sputtering silver selenide and more particularly to a method and apparatus for controlling defect formation and structural phases in sputtered silver selenide layers.

BACKGROUND OF THE INVENTION

Noble metal doped chalcogenide glasses, such as silver selenide, are presently of great interest for use in non-volatile memory devices. Non-volatile memory devices employing thin films of doped chalcogenide glasses offer several advantages over conventional devices, especially with regard to non-volatile memory speed, thermal characteristics, durability and reliability.

Thin film doped deposition is an important aspect of fabricating memory devices containing metal doped chalcogenide glasses. Because these films play an important role in the electrical performance of such memory devices, it is desirable that these deposited layers be defect free. This is especially true when such memory devices are used in ultra large scale integration (ULSI) devices, whose sub-micron structure greatly increases the need for thin film defect control. For example, thin film defects may be 10 to 100 times larger than typical ULSI device structures and thus can easily cause shorting and other electrical performance problems.

Silver selenide is a desirable chalcogenide glass material for use in fabricating non-volatile memory devices. To date, however, there has been only limited research into the fundamental properties of silver selenide thin films. Furthermore, most of this research involves forming silver selenide films via an evaporation deposition technique. Evaporation deposition, however, is not well suited for industrial application and has an attendant problem in that the dissociative properties of silver selenide make it difficult to achieve precision stoichiometries in the deposited film.

Physical vapor deposition, also known as "sputtering," is more easily adaptable to industrial applications and also provides better coating thickness and quality control than evaporation deposition techniques. Silver selenide, however, exhibits defect formation during conventional sputter deposition due to localized high temperatures, which occur during the sputtering operation.

Sputtering devices have long been used by the semiconductor processing industry to coat substrates (e.g., silicon wafers) with various materials (e.g., aluminum, titanium, gold, etc.) during the manufacture of integrated circuits. Generally, in a sputtering device, the material to be deposited or sputtered onto the substrate is contained in a target. The substrate is placed on a substrate support table in a sputtering chamber. Air in the sputtering chamber is evacuated and replaced with an inert gas such as argon, usually at a low pressure. An electric field is then established between an anode, such as the walls that line the sputtering chamber, and the target, which acts as an cathode (electron source). The resulting potential gradient causes electrons to be emitted from the target surface. As these electrons are drawn toward the anode by the electric field, they strike and ionize some of the inert gas molecules. These positively charged inert gas ions are then drawn toward and collide with the negatively charged target. The ions impact the target with sufficient energy to dislodge, or sputter, particles of target material into the sputtering chamber. The substrate to be coated, which is usually positioned in the chamber with its surface facing the target, receives some of the sputtered target particles, which adhere to and coat the substrate. The cloud of free electrons, inert gas atoms, inert gas ions, and sputtered target particles that exists near the target sputtering surface is termed a "plasma discharge."

The location of the plasma discharge may be controlled using magnetron sputtering devices, which introduce a magnetic field adjacent to the sputtering surface of the target in the sputtering chamber. The magnetic field is generated by a rotating magnetic circuit located on the side of the target opposite the sputtering surface. The magnetic field acts to trap electrons in a desired region, thus producing a region of high-density plasma. This region of high-density plasma rotates with the magnetic circuit about an axis that is perpendicular to the target sputtering surface. Thus, deep erosion of the target sputtering surface occurs in the region where the high density plasma is produced, while other portions of the target are hardly sputtered at all. This preferentially sputtered region of the target is often referred to as the racetrack portion, due to the characteristic ovoid-shaped area of the target that is eroded by the high-density plasma discharge.

It is generally known that the sputtering process generates a substantial amount of energy, which results in heating of the sputtering target. This heating is caused by the high electrical potential and current applied to the target material and by the energy delivered to the target by the bombarding ions. The heat generated during sputtering needs to be dissipated; otherwise it may damage the target and other components of the magnetron sputtering device and, in the case of silver selenide targets, may cause defect formation on the target material. In one previously known approach for cooling a sputtering target, a water-tight cooling chamber is formed on the side of the target opposite the target sputtering surface. The non-sputtering surface of the target forms one wall of the cooling chamber. The cooling chamber is filled with coolant (e.g., water), which floods the non-sputtering surface of the target and dissipates the heat generated during sputtering.

During the conventional sputter deposition of silver selenide using a magnetron sputtering device, millimeter sized defects rapidly form on the surface of the target, especially in the target racetrack area. Silver selenide target surface defect formation causes increased defect formation in and on the deposited film. This defect formation results from localized heating of the target during sputtering coupled with both the relatively low phase transition point of selenide and the low melting point of silver. It is thought that the associated heating of the $Ag_2Se$ target during sputtering promotes the diffusion of silver into the $Ag_2Se$ target, which causes natural protrusions to grow on the target. These defects are then transferred to the deposited film during sputtering, causing undesired localized stoichiometric variations in the deposited film.

Thus, in view of the foregoing, there is a desire and need for an improved method of sputtering a silver selenide target with a reduced target temperature, which in turn reduces target and deposited film defect formation.

BRIEF SUMMARY OF THE INVENTION

Embodiments of the invention provide a method and apparatus for sputter depositing a silver selenide film on a substrate, while maintaining a sputter target temperature at least below about 350° C. and preferably below about 250° C. Desirable sputtering processes include magnetron RF, DC, and pulse DC sputtering.

In one embodiment, silver selenide films are sputter deposited by employing a silver selenide target having a temperature maintained below about 350° C., more preferably below about 250° C., wherein said target temperature is maintained by conducting the sputtering process under a sputter power below about 200 W, more preferably below about 100 W.

In another embodiment, silver selenide films are sputter deposited by employing a silver selenide target having a temperature maintained below about 350° C., more preferably below about 250° C., wherein said target temperature is maintained by conducting the sputtering process with a sputter gas maintained at a pressure of less than about 40 mTorr, more preferably less than about 10 mTorr.

In another embodiment, silver selenide films are sputter deposited by employing a silver selenide target having a temperature maintained below about 350° C., more preferably below about 250° C., wherein said target temperature is maintained by conducting the sputtering process employing a sputter gas with a molecular weight greater than that of neon.

In yet another embodiment, silver selenide films are sputter deposited by employing a silver selenide target having a temperature maintained below about 350° C., more preferably below about 250° C., wherein said target temperature is maintained by conducting the sputtering process using a target cooling apparatus with coolant flow rates at least above 2.5 gal/min and coolant temperature at least below 25° C.

In another embodiment, silver selenide films are sputter deposited by employing a silver selenide target having a temperature maintained below about 350° C., more preferably below about 250° C., wherein said target temperature is maintained by conducting a sputter process under a sputter power density of less than about 1 W/cm$^2$.

In another embodiment, silver selenide films are sputter deposited by positioning a magnetron of the sputtering system such that the silver selenide target temperature is maintained below about 350° C., more preferably below about 250° C.

Desirable sputter apparatuses of the present invention include sputtering systems with cooling apparatuses capable of maintaining a silver selenide target at a temperature at least below about 350° C. and preferably below about 250° C. during sputter deposition. Other desired sputtering apparatuses include magnetron sputtering systems using a magnetron positioned so as to maintain a target temperature of less than about 350° C. and preferably less than about 250° C. during sputter deposition.

The methods and apparatuses of the present invention are particularly useful for controlling defect formation during sputter deposition of silver selenide thin films.

BRIEF DESCRIPTION OF THE DRAWINGS

The features mentioned above and other features and advantages of the present invention will be better understood from the following detailed description, which is provided in connection with the accompanying drawings in which.

DETAILED DESCRIPTION OF THE INVENTION

In the following detailed description, reference is made to various specific structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "silver selenide" is intended to include various species of silver selenide, including some species which have a slight excess or deficit of silver, for instance, Ag$_2$Se, Ag$_{2+x}$Se, and Ag$_{2-x}$Se.

The term "defect free silver selenide film" as used in this application is defined as silver selenide films having less than about 0.16 defect counts/cm$^2$.

The present invention relates to a method of controlling defect formation in deposited silver selenide and to a method of depositing a silver selenide film having a mixture of alpha and beta phases. In accordance with the invention, silver selenide is deposited using a sputtering process that maintains the silver selenide target temperature at less than about 350° C. and preferably less than about 250° C.

Figure 1:
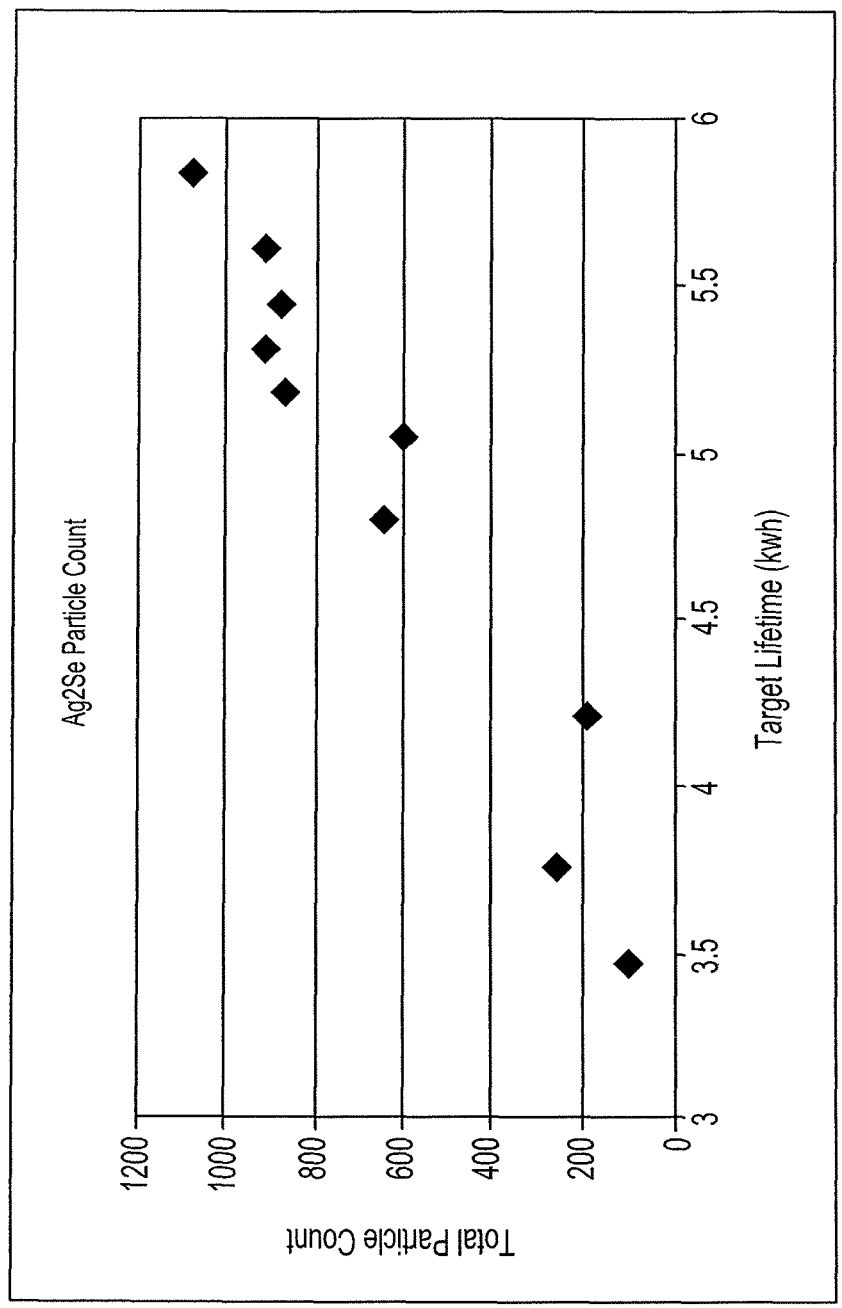
FIG. 1 is a graph showing total particle count vs. target lifetime for a silver selenide sputtering target.
Figure 2B:
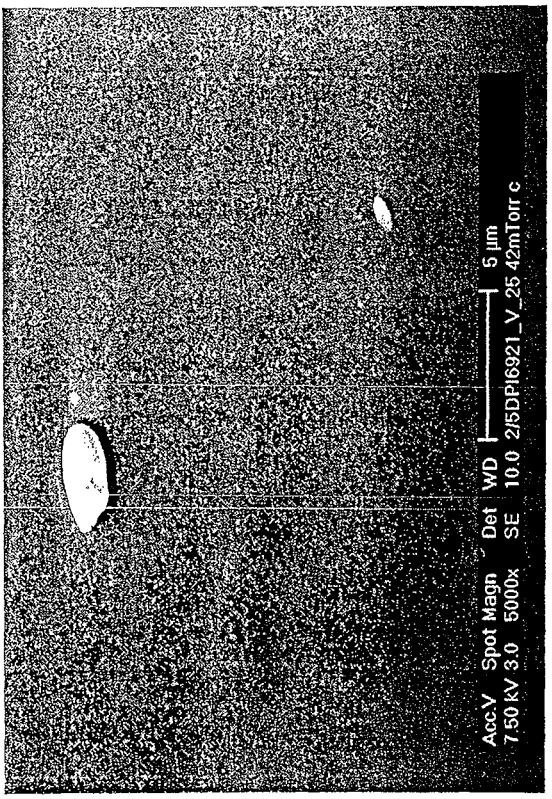
FIGS. 2(a) and 2(b) illustrate scanning electron microscope images showing typical defects deposited on and in a sputter deposited silver selenide film.
Figure 2A:
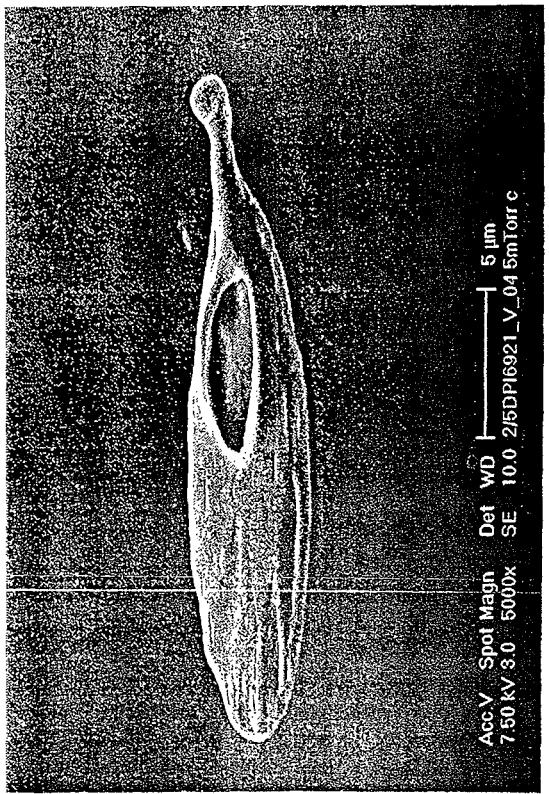

During the conventional sputter deposition of silver selenide, target defect count has been observed to increase from less than fifty to over thousands per wafer after only very short target consumption (2-3 kwh), as illustrated in FIG. 1. Although these defects can be reduced to under fifty counts by gently wiping the target, after another several kwh sputter deposition, the surface of the target will again exhibit severe defect formation. These target defects in turn cause increasing defect formation in and on the deposited film. FIGS. 2(a) and 2(b) represent typical scanning electron microscope (SEM) images of defects formed on deposited silver selenide films.

Based on the film deposition rate for silver selenide, target consumption of about 2-3 kwh represents deposition of silver selenide on only several hundred wafers. This wafer deposition rate is not practical for commercial production. Furthermore, in order to obtain the proper film composition and resistivity, the silver selenide target requires at least 0.5 kwh of conditioning each time the target chamber is vented for target cleaning. Thus, the usable target life between cleanings is even further reduced.

Figure 3B:
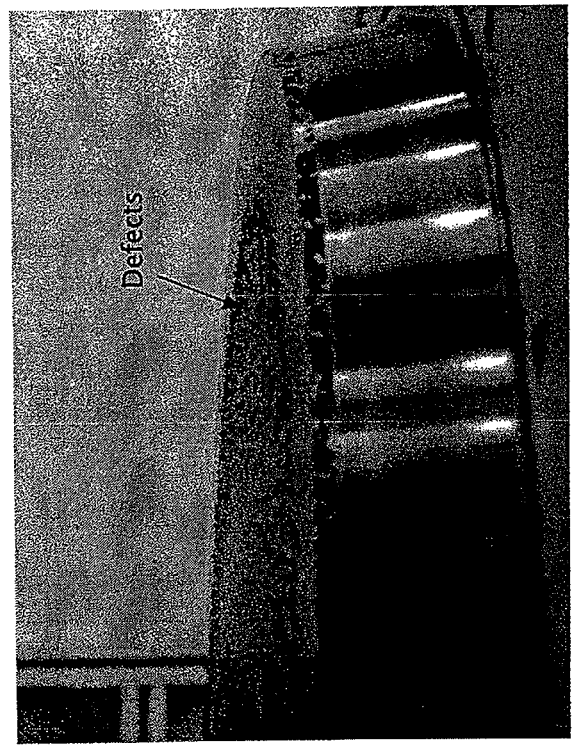
FIGS. 3(a) and 3(b) show images of typical black porous defects formed on an Ag$_2$Se sputter target after 3 kwh of target consumption during sputter deposition.
Figure 3A:
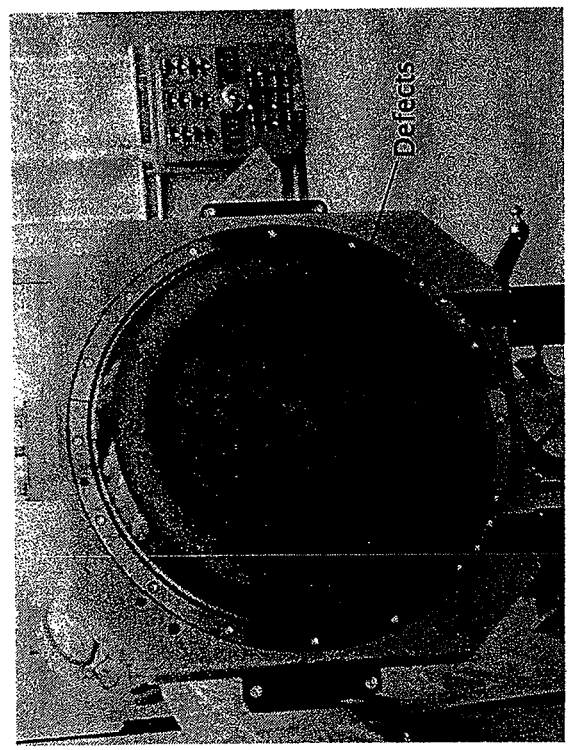

The defect shapes shown in FIGS. 2(a) and (b) lead the present inventors to believe that the deposited silver selenide defects could be due to a micro arching on the silver selenide target, which subsequently forms a splatter defect in and on the silver-selenide film. This belief is supported by FIGS. 3(a) and (b), showing two images of an Ag$_2$Se target after 3 kwh of target consumption. The images clearly show many black porous chips, which are approximately millimeter sized. FIGS. 3(a) and (b) also show that the defect density reaches its highest on the racetrack portion of the target.

Silver selenide (e.g. Ag$_2$Se) is well known for its low temperature phase transition point of 406 K (about 130° C.). At temperatures below 406 K, Ag$_2$Se forms an orthorhombic structure, known as the "beta phase." At temperatures above 406 K (about 133° C.), Ag$_2$Se undergoes a structural change in which the Se forms a body-centered cubic sublattice, while the Ag undergoes a melting transition. In this so-called "alpha phase" or "superionic phase," the Ag ions exhibit liquid-like diffusion. At around 1170 K (897° C.), the Se sublattice will also undergo a melting transition.

During magnetron sputter deposition, the high electrical potential and current applied to the target as well as the energy imparted to the target via bombardment by the inert gas ions can cause localized heating of the sputter target in the regions where the high-density plasma discharge is concentrated. This heating effect is sufficient to raise the temperature of localized regions of the Ag$_2$Se target at least enough to accelerate the diffusion of Ag through the Ag$_2$Se target. This diffusion can cause natural protrusion growth on the target, which in turn explains the origin of the porous chip defects formed on the Ag$_2$Se target.

The origin of the black porous chip defects is further explained with reference to FIGS. 4(a), (b), (c), (d), (e), and (f), which show a series of SEM images taken on silicon oxide wafers on which Ag$_2$Se films were sputter deposited and then in situ annealed at varying temperatures. In this experiment, wafer stages were brought up to various temperatures at least thirty minutes prior to loading a wafer onto the stage. Wafers were then loaded onto the wafer stages and annealed for 5 minutes. Each wafer was then loaded into a cooling chamber and cooled back to room temperature. All deposition, annealing, and cooling processes were in situ processes, which reduces the risk of contamination problems.

Figure 4:
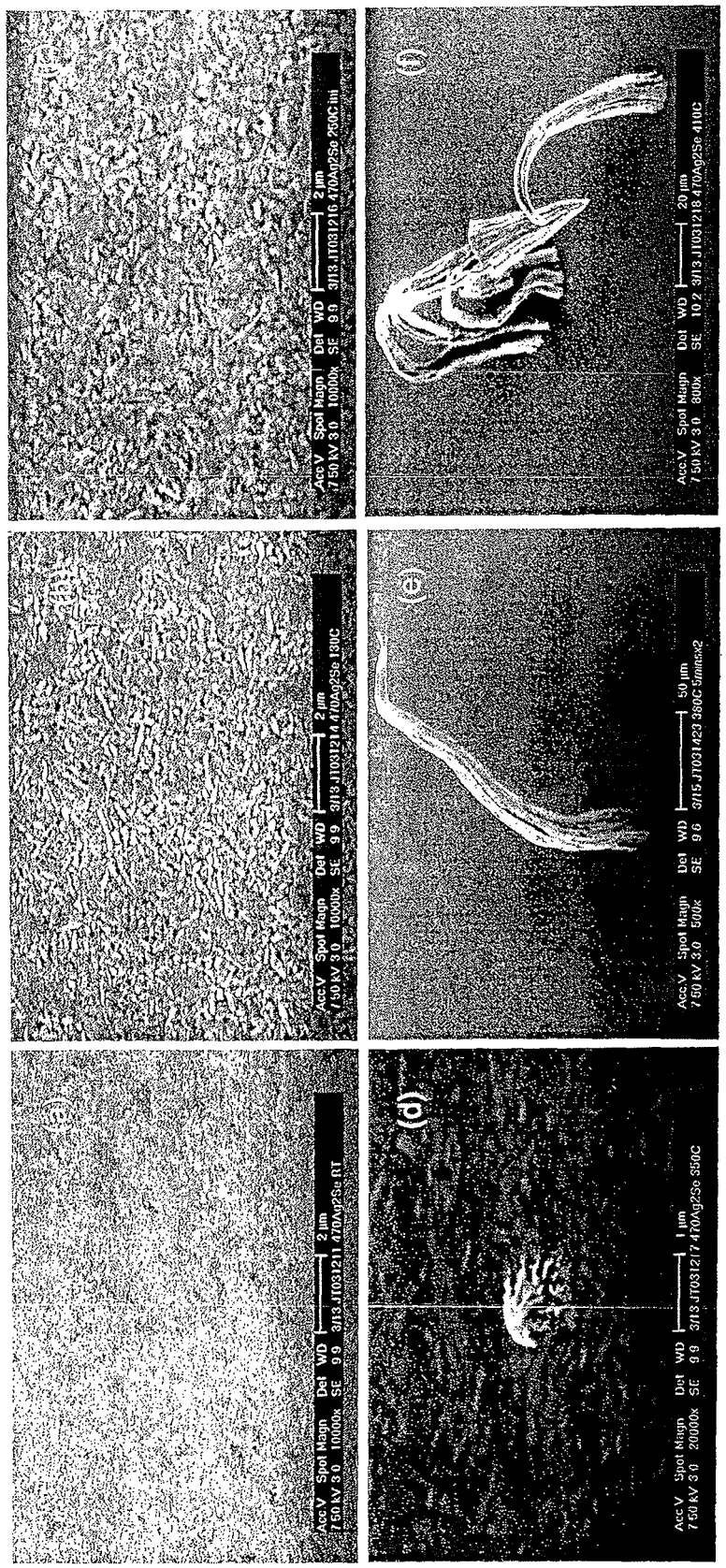
FIG. 4(a) shows a deposited silver selenide film formed according to one embodiment of the prior art.
FIG. 4(b) shows a silver selenide film structure change when the silver selenide film of FIG. 4(a) is annealed at 130° C.
FIG. 4(c) shows further silver selenide film structure changes when the silver selenide film of FIG. 4(a) is annealed at 250° C.
FIG. 4(d) shows cone defect formation when the silver selenide film of FIG. 4(a) is annealed at 350° C.
FIG. 4(e) shows whisker-like defect formation when the silver selenide film of FIG. 4(a) is annealed at 380° C.
FIG. 4(f) shows millimeter-sized whisker-like defect formation when the silver selenide film of FIG. 4(a) is annealed at 410° C.

FIG. 4(a) shows a silicon wafer with a deposited silver selenide film at room temperature. The as-deposited film appears smooth. FIG. 4(b) shows a silicon wafer with a deposited silver selenide film after annealing at 130° C. As illustrated in FIG. 4(b), the silver selenide film clearly shows a structure change. FIG. 4(c) shows a silicon wafer with a deposited silver selenide film after annealing at 250° C., while FIG. 4(d) shows a silicon wafer with a deposited silver selenide film after annealing at 350° C. The silver-selenide film of FIG. 4(d) clearly shows the development of a cone-like defect. FIGS. 4(e) and 4(f) show silicon wafers with deposited silver selenide films after annealing at 380° C. and 410° C. respectively. The silver selenide films of FIGS. 4(e) and 4(f) show a progression in defect size from the cone defect of FIG. 4(d) to larger whisker-like defects. These whisker-like defects are on the millimeter scale in size and are clearly visible on the wafer with the unaided eye. Accordingly, comparison of the defect formation on the annealed silver selenide films with the defect formation observed on the Ag$_2$Se target during sputtering lead the present inventors to understand that controlling the target temperature during Ag$_2$Se deposition is desirable for controlling defect formation in and on the target and the deposited film.

Figure 11:
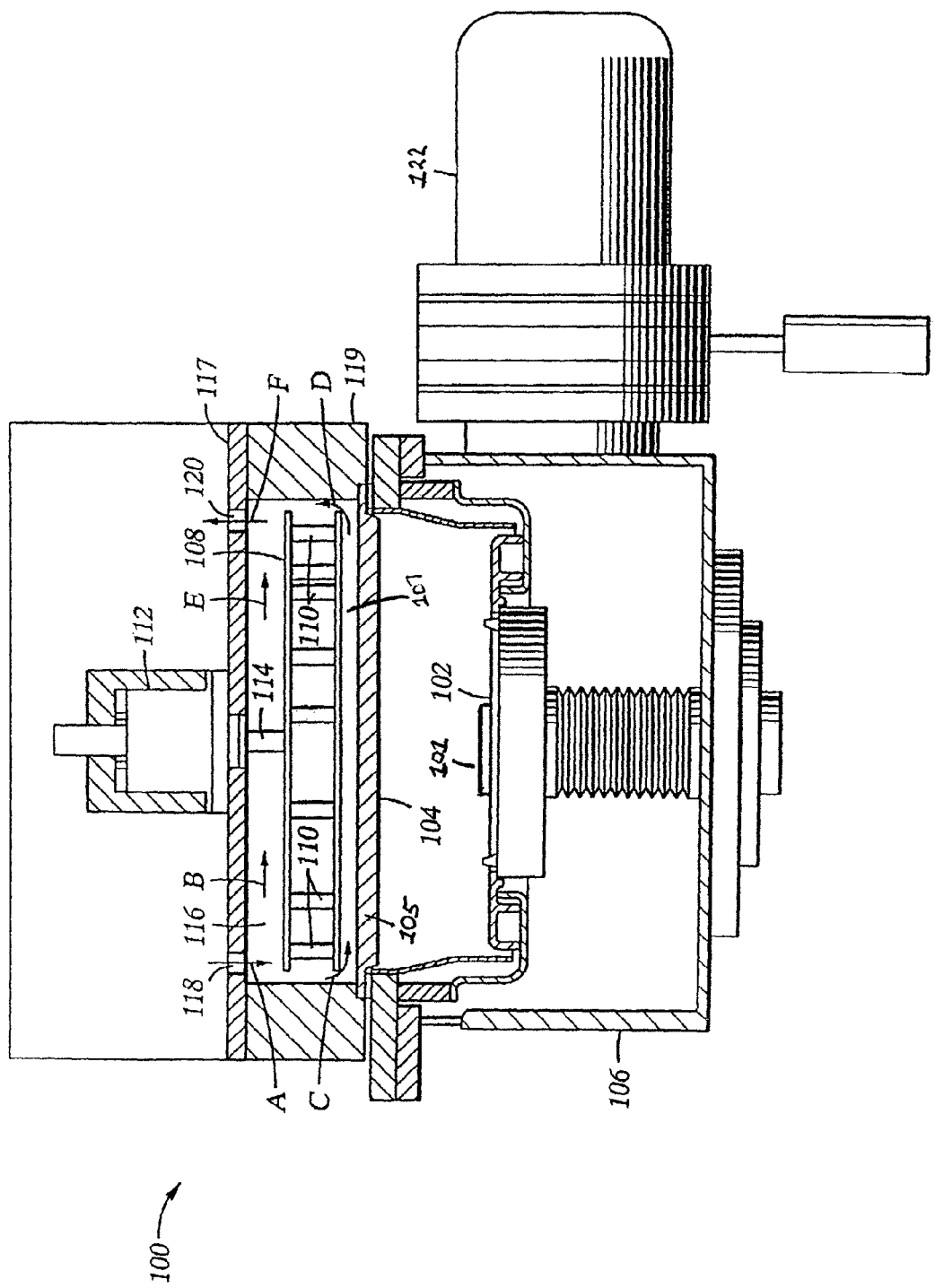
FIG. 11 shows a simplified example of a magnetron sputtering device to be used to carry out the embodiments of the invention.

FIG. 11 shows a simplified example of a magnetron sputtering device 100, similar to that used in the exemplary embodiments described below. Generally, the device 100 comprises a substrate support table 102, target 104, target backing plate 105, and a magnetron 108. During sputtering, a substrate 101 is placed on the substrate support table 102 and raised to a position near the target 104 inside the chamber 116. Using a pump 122, air in the sputtering chamber is evacuated and replaced with an inert sputter gas, usually at a low pressure. The sputter gas may be any suitable sputtering gas such as argon, neon, xenon and combinations thereof. A motor assembly 112 provides rotational motion to the magnetron 108 through a shaft 114 to rotate the magnetron 108 at about 100 rpm. The plasma discharge occurs in the space between the substrate and the target 104, coating the substrate with sputtered target particles. As described above, this process may cause heating of the target, which is disadvantageous to silver selenide deposition.

An exemplary system of the magnetron sputtering device 100 described above is the Applied Materials Endura magnetron sputtering system using an ENI pulsed DC power supply. Accordingly, except where indicated, silver selenide deposition according to the exemplary embodiments of the present invention discussed below was performed using an Applied Materials Endura magnetron sputtering system using an ENI pulsed DC power supply with a 350 W, 200 KHz, 1056 ns pulse width. The sputtering target used in each exemplary embodiment was a silver selenide target approximately 13 inches in diameter and approximately ⅛ inch thick. The silver selenide target purity was at least 99.95%. All embodiments of the present invention are designed to maintain a silver selenide target temperature at less than about 350° C. and preferably less than about 250° C. during sputtering.

As discussed above, silver selenide undergoes a structural change from the "beta phase" to the "alpha phase," in which the Se forms a body-centered cubic sublattice, at temperatures above 406 K (about 133° C.). In accordance with the present invention, it is desirable for the deposited silver selenide film to be formed from a mixture of the alpha and beta silver selenide phases. Such mixture is critical for the optimal performance of certain devices formed from silver selenide films. Conventional silver selenide sputter techniques produce deposited silver selenide films predominantly consisting of beta silver selenide. According to the present invention, silver selenide films containing both alpha and beta phases may be formed via a sputtering process under conditions of lower power/higher pressure. Furthermore, formation of alpha phase silver selenide is enhanced by heating of the substrate.

Figure 13:
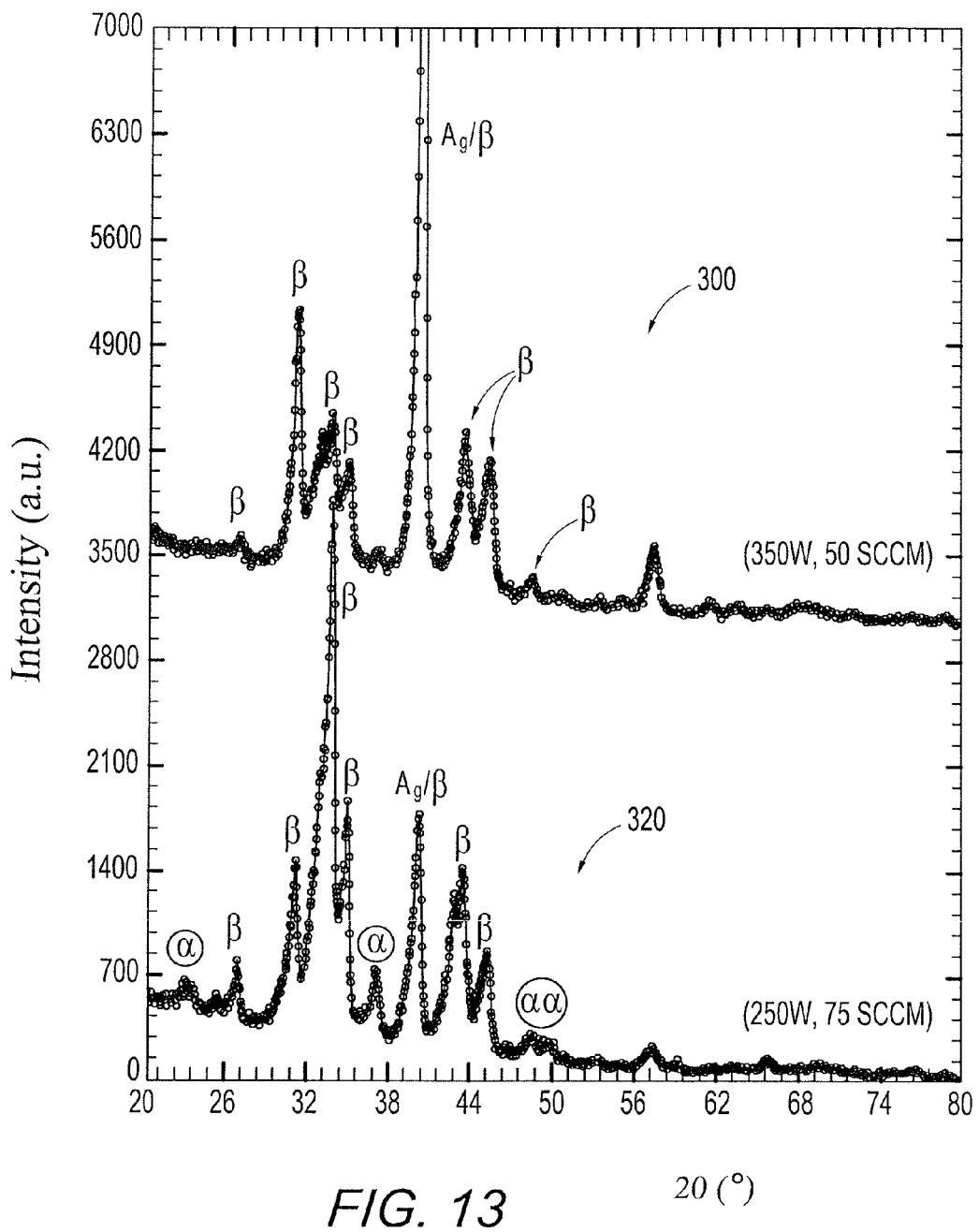
FIG. 13 shows two x-ray diffraction scans of deposited silver selenide films sputtered under different sputter pressures and powers.

FIG. 13 shows two x-ray diffraction (XRD) scans 300, 320 of sputter deposited silver selenide films. Scan 1 shows an XRD scan 300 of a silver selenide film sputter deposited at a sputter power of 350 W and an argon sputter gas flow rate of 50 sccm, which corresponds to a sputter gas pressure of about 7 mTorr. Scan 2 shows an XRD scan 320 of a silver selenide film sputter deposited at a sputter power of 350 W and an argon sputter gas flow rate of 75 sccm, which corresponds to a sputter gas pressure of about 10 mTorr. The scans 300, 320 show that, under the latter conditions, alpha and beta peaks appear around 23 and 37 degrees in a glancing mode 2θ XRD scan.

While not being limited by theory, based on the XRD scans 300, 320, it appears that a lower energy impact of silver selenide with the substrate during sputtering yields more alpha phase silver selenide in the deposited film. Lower sputter power and higher sputter pressure decrease the kinetic energy imparted to the sputtered silver selenide molecules, thus resulting in a lower energy impact of silver selenide with the substrate. Furthermore, it also appears that heating the substrate to an a temperature above room temperature (about 25 C) also enhances the alpha phase in the deposited film.

While the crystalline structure of silver selenide (i.e. mixture of alpha and beta phases) is important for the optimal performance of devices employing such films, the film texture (e.g. smoothness), and defects in or on the film also affect device performance. Thus, to the extent decreases in sputter power or increases in sputter pressure result in films exhibiting a rough or defect-laden surface, a balance in the sputter power and pressure parameters must be struck in order to produce smooth, defect-free silver selenide films, whose structure exhibits both alpha and beta phases. However, it should be emphasized that, independent of the process method used to produce the film, it is desirable to have the alpha phase present in deposited silver selenide films.

In a sputtering process in accordance with a first exemplary embodiment of the invention, a silver selenide film is sputter deposited using the magnetron sputtering system described above, but maintaining a sputter power such that the temperature of the silver selenide target 104 is maintained at less than about 350° C. and preferably less than about 250° C. during sputtering.

Figure 5:
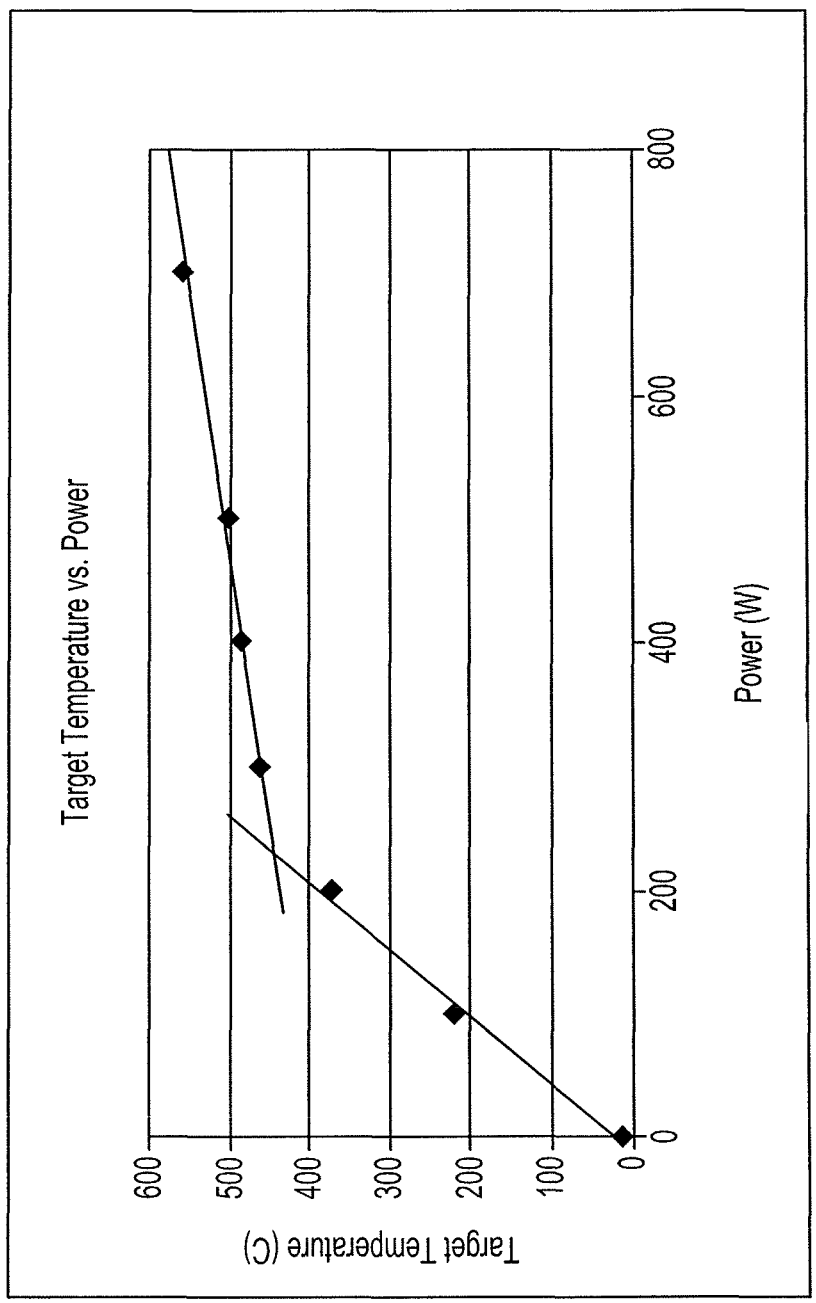
FIG. 5 is a graph illustrating the relationship between target temperature and sputter power during silver selenide deposition.

Generally, reducing the sputter power reduces the kinetic energy imparted to the target during sputtering and, thus, lowers target temperature. As shown in FIG. 5, target temperature is directly related to sputter power such that increasing sputter power increases target temperature. For the sputtering system 100 described above and as illustrated in FIG. 5, target temperature is maintained at less than 350° C. at sputter powers below about 200 W. As also shown in FIG. 5, target temperature can be further reduced to below about 250° C. at sputter powers less than about 100 W.

In accordance with a second exemplary embodiment of the invention, a silver selenide film is deposited using the Applied Materials Endura magnetron sputtering system described above, but maintaining a sputter gas pressure less than about 40 mTorr and preferably less than about 10 mTorr so as to maintain a temperature of the silver selenide target of less than about 350° C. and preferably less than about 250° C. during sputtering.

Figure 6:
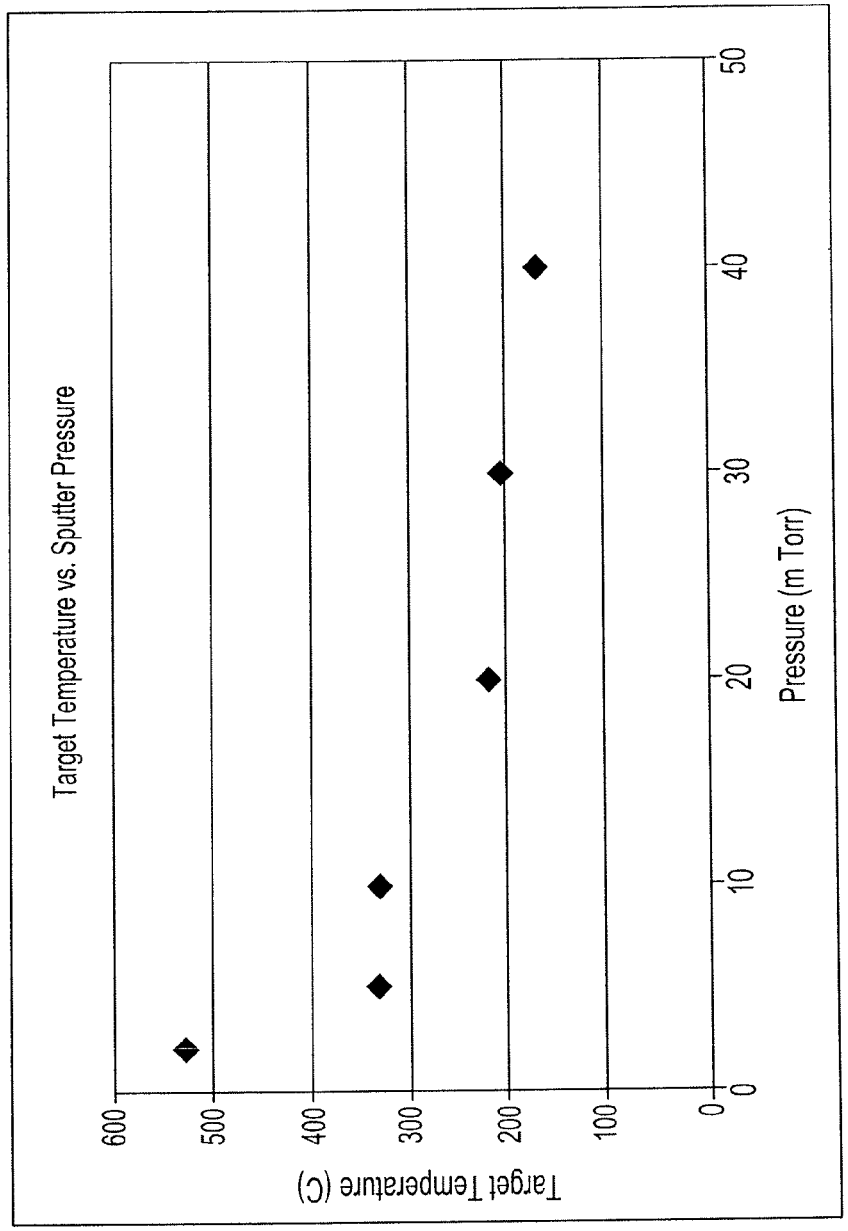
FIG. 6 is a graph illustrating the relationship between target temperature and sputter pressure during silver selenide sputter deposition.

As indicated in FIG. 6, increasing the sputter gas pressure lowers the target temperature during sputtering. This reduction in temperature as sputter gas pressure increases is due to a reduction in the kinetic energy of bombardment imparted to the target by the impact of the inert gas ions during sputtering. FIG. 6 illustrates the correlation between target temperature and sputter pressure for the sputter process described above, using argon as the sputter gas. According to FIG. 6, silver selenide target temperature is reduced to less than about 350° C. at a sputter pressures greater than about 5 mTorr. Furthermore, target temperature is reduced to less than about 250° C. at sputter pressures greater than about 15 mTorr.

Figure 7:
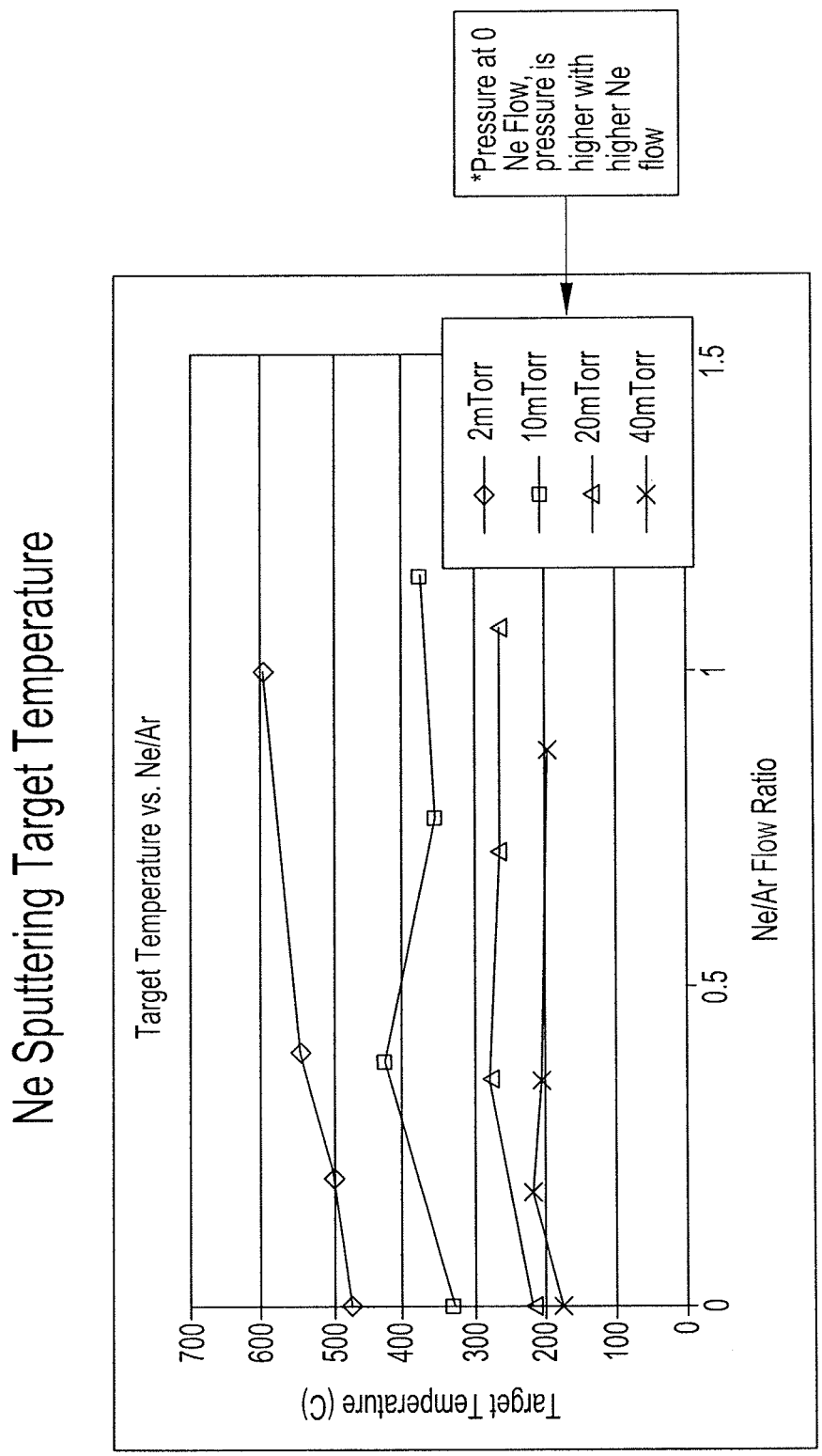
FIG. 7 is a graph illustrating the relationship between target temperature and Ne/Ar sputter gas flow ratio at varying pressures during silver selenide sputter deposition.
Figure 8:
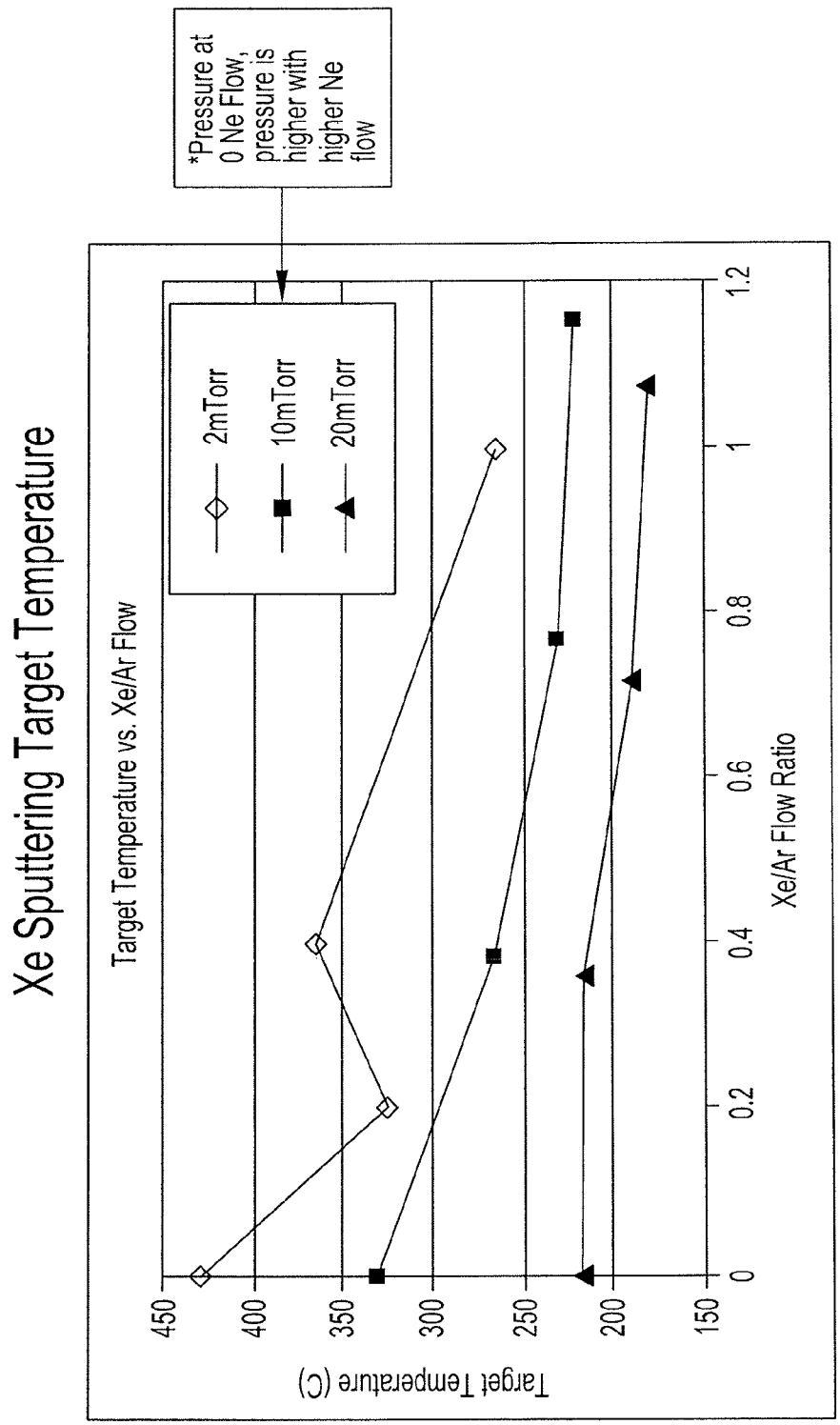
FIG. 8 is a graph illustrating the relationship between target temperature and Xe/Ar flow ratio at varying pressures during silver selenide sputter deposition.
Figure 9:
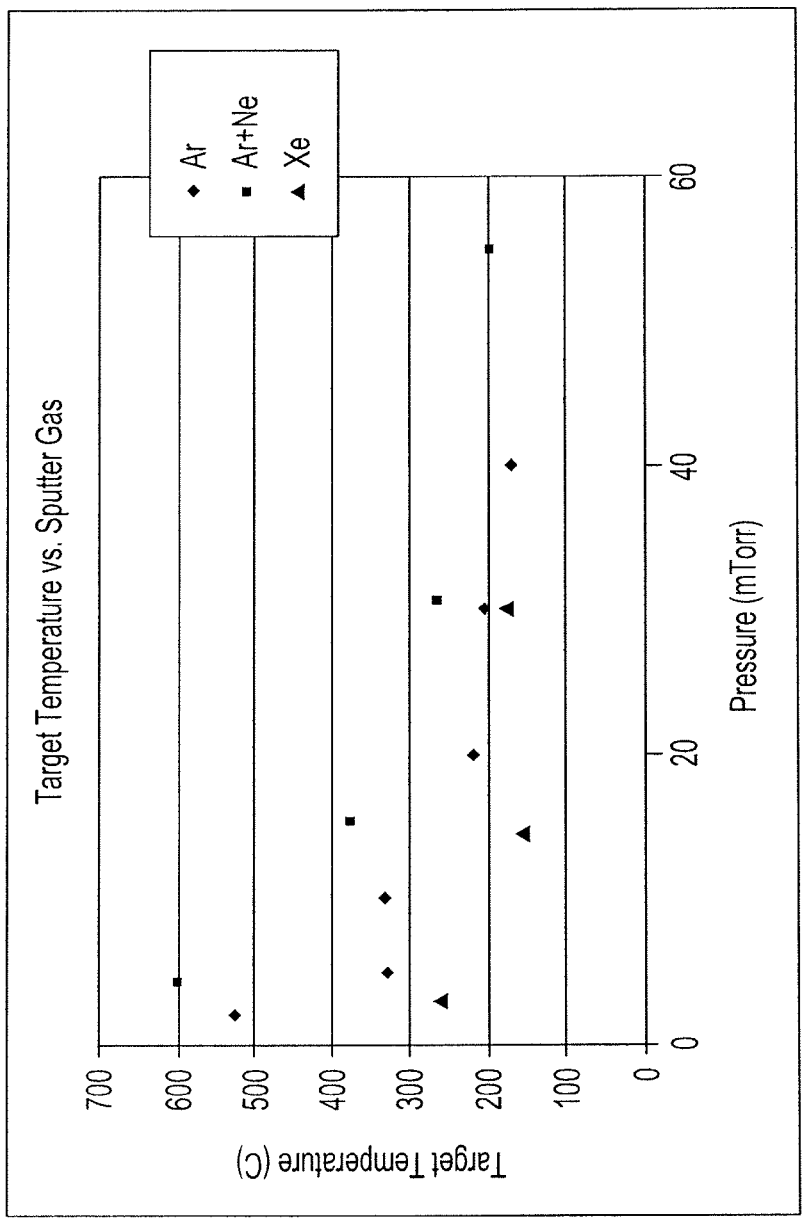
FIG. 9 is a graph illustrating the relationship between target temperature and sputter gas.

Referring now to FIGS. 7-9 and in accordance with a third exemplary embodiment of the invention, a silver selenide film is sputter deposited using the Applied Materials Endura magnetron sputtering system described above, but using a sputter gas with a molecular weight at least greater than that of neon such that the silver selenide target temperature is maintained at about 350° C. and preferably less than about 250° C. during sputtering. While the preferred sputtering gas is xenon, the present invention is not so limited. The inventors have discovered that at least xenon, argon, and mixtures of these induce the desired reduction in silver selenide target temperature as shown in FIGS. 8 and 9.

Sputter gasses with higher molecular weight than that of neon, such as argon and xenon, reduce the kinetic energy imparted to the target during sputtering. FIG. 7 shows the correlation between the sputter target temperature and Ne/Ar sputter gas flow ratio at various sputter gas pressures. According to FIG. 7, at least at the lower sputter pressures indicated, increasing the proportion of neon in the sputter gas mix induces higher sputter target temperatures. Furthermore, when the Ne gas in the Ne/Ar sputter gas flow ratio of FIG. 7 is replaced with xenon gas, as shown in FIG. 8, there is a clear decrease in target temperature at the sputter gas pressures indicated. FIG. 9 also shows the relationship between target temperature and sputter gas at various sputter gas pressures. As shown in FIG. 9, using a sputter gas containing a mixture of argon and neon results in higher target temperatures than use of either argon or xenon alone.

FIG. 8 also shows that, as the molecular weight of the sputter gas increases (i.e. increasing Xe/Ar ratio) target temperature is quickly reduced to at least less than about 350° C. at a sputter pressure of 2 mTorr. At the relatively higher pressures shown in FIG. 8 (10 mTorr and 20 mTorr), the target was cooled to less than about 250° C. Sputter gas pressures of less than about 10 mTorr are desirable because they have been shown to prevent the formation of nodular defects in the deposited silver selenide films with high silver concentrations (e.g. higher than about 67.5% Ag). Furthermore, lower sputter gas pressures allow for the deposition of silver selenide films with greater stoichiometric precision.

In accordance with a fourth exemplary embodiment of the invention, silver selenide target cooling is achieved by improving the target cooling apparatus of the sputter deposition system. Referring to FIG. 11, a typical magnetron sputtering device 100, described above, comprises a magnetron 108, which is disposed within a cooling chamber 116. The cooling chamber 116 is defined by a top 117, two sides 119 and the target backing plate 105. A cooling fluid, such as water, enters the cooling chamber 116 at an inlet 118, circulates around the magnetron 108, and exits through an outlet 120. The arrows A-F show the generalized water flow paths around the magnetron 108.

The present inventors have discovered that silver selenide target cooling to at least below 350° C. and preferably less than about 250° C. can be achieved by increasing the coolant flow between the magnetron 108 and the target backing plate 105 (as shown by arrows C and D), decreasing coolant temperature, and improving the thermal conductivity between the coolant and target backing plate 105. For example, coolant flow rates are at least above 2.5 gal/min and coolant temperature is at least below 25° C. to allow selenide target cooling to at least below 350° C. and preferably less than about 250° C. Furthermore, the backing plate should be constructed from materials designed to optimize backing plate/coolant contact and the target backing plate should be colored black in order to improve heat radiation.

In accordance with a fifth exemplary embodiment of the invention, silver selenide target temperature is maintained below about 350° C. and preferably less than about 250° C. during sputtering by maintaining an effective sputter power density on the target of less than about 1 W/cm$^2$.

Figure 12A:
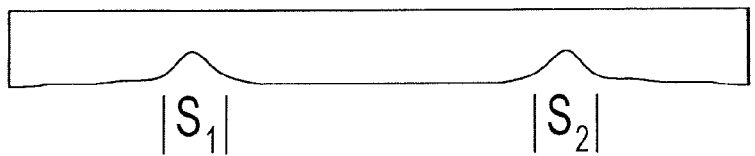
FIG. 12(a) shows a cross sectional view of a non-uniform target sputter profile.
Figure 12B:
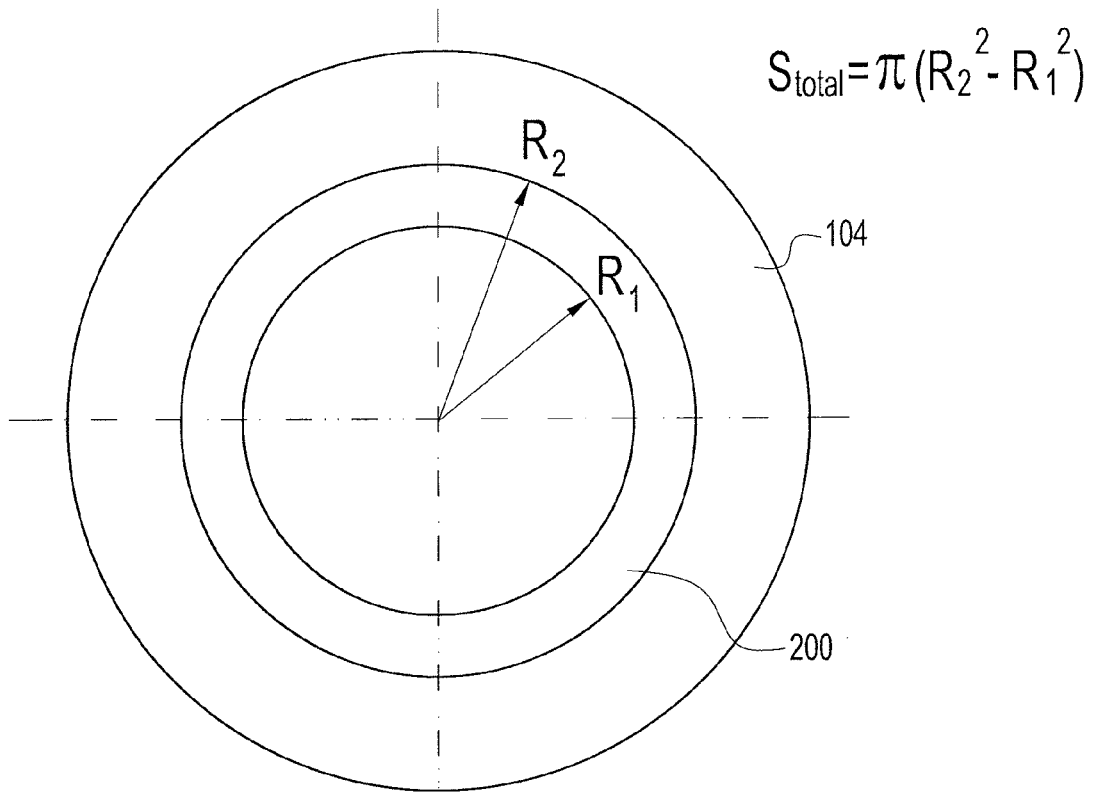
FIG. 12(b) shows a top view of a non-uniform target sputter profile, which forms a characteristic racetrack shape.
Figure 12C:
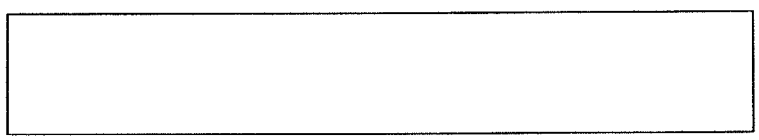
FIG. 12(c) shows a cross sectional view of a uniform target sputter profile.

The target sputter area of a sputtering apparatus will vary according to the particular apparatus used. As described below, the area of the target actually used during sputtering can range from only a portion of the entire target, as shown in FIGS. 12(*a*) and 12(*b*), to the entire target, as shown in FIG. 12(*c*). According to the present invention, sputter parameters, such as the sputter power, for a particular sputter apparatus are varied such that the effective sputter power density of the sputter apparatus is less than about 1 W/cm$^2$.

Figure 10:
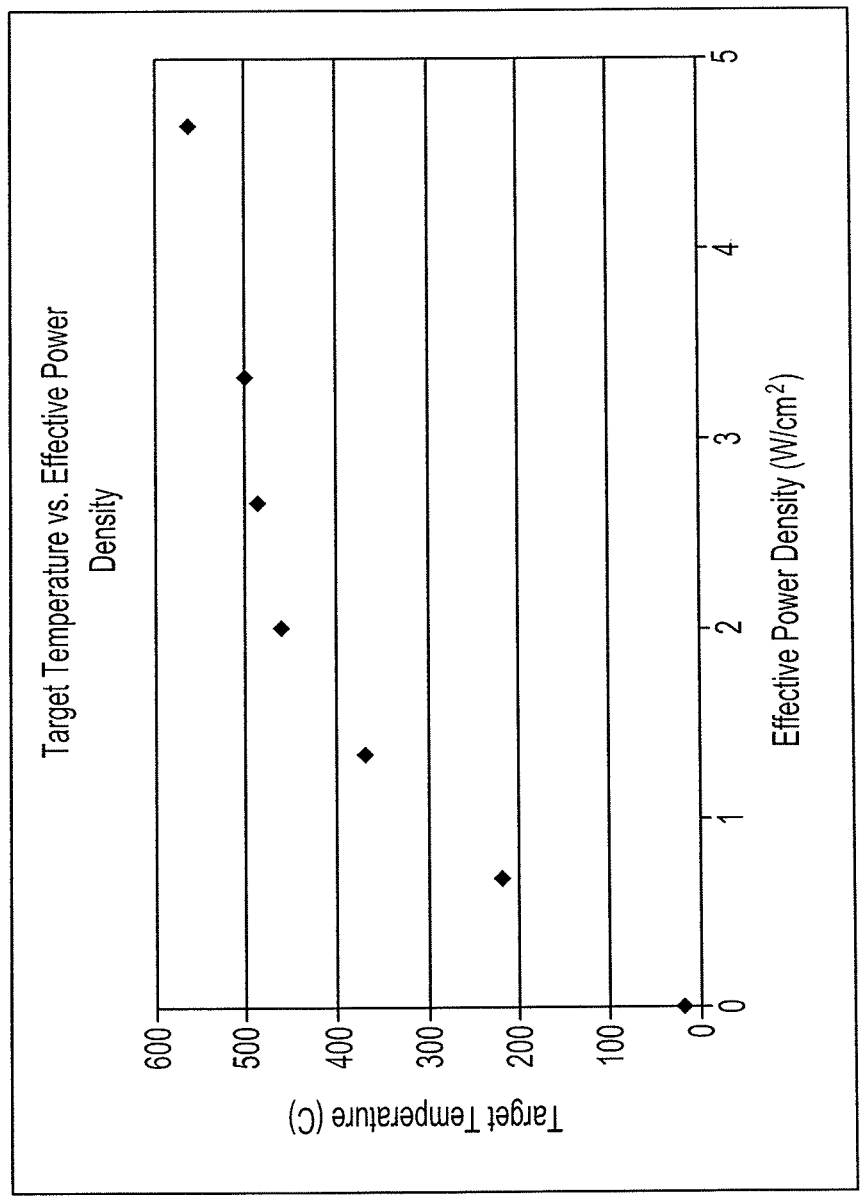
FIG. 10 is a graph illustrating the relationship between target temperature and effective sputter power density.

As described above, FIG. 5 shows a graph of Target Temperature v. Sputter Power for the Applied Materials Endura Sputter system described above, using argon as the sputter gas, and clearly indicates an increase in target temperature as sputter power is increased. However, the sputter area of the target, also impacts target temperature. Thus, controlling effective sputter power density (sputter power per unit of sputter area) provides more accurate control of silver selenide target temperature. Silver selenide target temperature as a function of effective sputter power density is plotted in FIG. 10 and clearly shows that silver selenide target temperature is maintained below about 350° C. and preferably less than about 250° C. during sputtering by maintaining an effective sputter power density on the target of less than about 1 W/cm$^2$.

FIG. 12(*a*) shows a cross sectional view of a non-uniform target sputter profile, which represents the sputter area of the target. During sputtering, areas of target erosion, $S_1$ and $S_2$, are caused by the high-density plasma as it moves across the target within the magnetic filed generated by the magnetron. As described above, this preferentially sputtered region of the target is often referred to as the racetrack portion, due to the characteristic ovoid-shaped area of the target that is eroded by the high-density plasma discharge. FIG. 12(*b*) illustrates a typical racetrack area 200 formed on a target 104 during sputtering. As shown, the total sputter area $S_{total}$ of the target is determined by the formula:

$$S_{total} = \pi(R_2^2 - R_1^2)$$

Effective sputter power density on the target can then be determined by dividing the sputter power of the sputtering system by $S_{total}$.

FIG. 12(*c*) shows a cross sectional view of a uniform target sputter profile. In this case, the sputter power is spread across the entire target area $S_{total}$. Similar to the non-uniform target sputter profile, sputter power density on the target can be determined by dividing the total sputter power by $S_{total}$.

In accordance with a sixth exemplary embodiment of the present invention, the magnetron in a magnetron sputtering system is positioned such that the target temperature is maintained below about 350° C. and preferably less than about 250° C. during sputtering.

As described above, FIG. 11 shows a typical magnetron sputtering device 100 comprising a target 104, target backing plate 105, and a magnetron 108. As the distance between the magnetron and the sputter target 107 is increased, the distribution of the magnetic field on the target also increases, causing the sputter area of the target to increase. Increasing sputter area has the effect of decreasing sputter power density, which, as described above, lowers target temperature during sputtering.

In accordance with a seventh exemplary embodiment of the present invention, a silver selenide film is sputter deposited under sputter conditions such that the structure of said silver selenide film comprises both the alpha phase and beta phases. Desirable sputter deposited silver selenide films consist primarily of alpha phase silver selenide. For example, using the applied Materials Endura magnetron sputtering system described above, silver selenide is sputter deposited using a sputter power of less than about 250 W and a sputter pressure of at least about 10 mTorr. Furthermore, under sputter conditions wherein the sputter power is less than about 200 W and the sputter pressure is about 10 mTorr or less, a defect-free silver selenide film comprising both the alpha and beta structural phases may be formed on a substrate.

Regardless of the sputtering apparatus used, heating the substrate to greater than about 30° C. results in greater formation of alpha phase silver selenide in the deposited film.

The present invention uses novel methods and apparatuses for silver selenide sputter deposition that decrease defects in deposited silver selenide films. Such methods and apparatuses of silver selenide defect control are useful in the production of certain non-volatile memory devices that require virtually defect-free silver selenide film layers. Furthermore, the present invention provides novel methods and apparatuses for silver selenide sputter deposition that are suitable to industrial application.

While separate exemplary embodiments of the invention have been described and illustrated, practice of the present invention is not limited to use of only one of these exemplary embodiments. One or more of the embodiments of the invention can be used separately or together to maintain a sputter target at a temperature of less than about 350° C. and preferably less than about 250° C.

Furthermore, while exemplary embodiments of the invention have been described and illustrated, various changes and modifications may be made without departing from the spirit or scope of the invention. Accordingly, the invention is not limited by the foregoing description, but is only limited by the scope of the appended claims.

What is claimed as new and desired to be protected by Letters Patent of the United States is:

1. A method comprising
    forming a memory device, the forming of the memory device comprising:
    providing a substrate; and
    sputter depositing a silver selenide film on a substrate to form a silver selenide film which comprises both alpha silver selenide and beta silver selenide.

2. The method of claim 1, wherein the sputtering comprises providing a sliver selenide target and maintaining the silver selenide target at a temperature of less than about 350° C. during the sputtering process.

3. The method of claim 2, wherein maintaining the target temperature of less than about 350° C. is achieved by injecting a sputter gas having a molecular weight greater than a molecular weight of neon into a sputter deposition chamber.

4. The method of claim 3, wherein the sputter gas is argon, xenon, or a combination of argon and xenon.

5. The method of claim 3, wherein the sputter gas is a combination of argon and xenon, wherein the flow ratio of the xenon to argon is equal to or greater than about 0.2 and wherein the sputter pressure is equal to or greater than about 2 mTorr.

6. The method of claim 2, wherein maintaining the silver selenide target temperature of less than about 350° C. is achieved by maintaining a sputter power of less than about 200 W during sputtering.

7. The method of claim 2, wherein maintaining the silver selenide target temperature of less than about 350° C. is achieved by maintaining an effective sputter power density of less than about 1 W/cm$^2$.

8. The method of claim 2, wherein maintaining the silver selenide target temperature of less than about 350° C. is achieved by maintaining a sputter gas pressure of less than about 40 mTorr.

9. The method of claim 2, wherein maintaining the silver selenide target temperature of less than about 350° C. is achieved by maintaining a sputter gas pressure of less than about 10 mTorr.

10. The method of claim 2, wherein maintaining the silver selenide target temperature of less than about 350° C. is achieved by positioning a magnetron a distance from the target so as to maintain a target temperature of less than about 350° C.

11. The method of claim 2, wherein maintaining the silver selenide target temperature of less than about 350° C. is performed by cooling the silver selenide sputter target with a cooling apparatus.

12. The method of claim 2, wherein the silver selenide target temperature is maintained at less than about 250° C. during the sputtering process.

13. A method comprising:
    forming a memory device, the forming of the memory device comprising:
    providing a substrate and a silver selenide sputter target in a sputter deposition chamber; and
    sputter depositing a silver selenide film on a substrate to form a silver selenide film which comprises both alpha silver selenide and beta silver selenide by injecting a sputter gas having a molecular weight greater than a molecular weight of neon into the sputter deposition chamber.

14. The method of claim 13, wherein the sputter gas is argon, xenon, or a combination of argon and xenon.

15. The method of claim 13, wherein the sputter gas is a combination of argon and xenon, wherein the flow ratio of the xenon to argon is equal to or greater than about 0.2 and wherein the sputter pressure is equal to or greater than about 2 mTorr.

* * * * *